(12) United States Patent
Kim et al.

(10) Patent No.: US 10,790,093 B2
(45) Date of Patent: *Sep. 29, 2020

(54) MULTILAYER CERAMIC ELECTRONIC COMPONENT ARRAY

(71) Applicant: SAMSUNG ELECTRO-MECHANICS CO., LTD., Suwon-si, Gyeonggi-do (KR)

(72) Inventors: Ho Yoon Kim, Suwon-si (KR); Sang Soo Park, Suwon-si (KR); Woo Chul Shin, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/572,068

(22) Filed: Sep. 16, 2019

(65) Prior Publication Data
US 2020/0118764 A1 Apr. 16, 2020

Related U.S. Application Data

(63) Continuation of application No. 16/203,381, filed on Nov. 28, 2018, now Pat. No. 10,468,195.

(30) Foreign Application Priority Data

Oct. 10, 2018 (KR) .................. 10-2018-0120589

(51) Int. Cl.
*H01G 4/38* (2006.01)
*H01G 4/30* (2006.01)
(Continued)

(52) U.S. Cl.
CPC .............. *H01G 4/38* (2013.01); *H01G 4/008* (2013.01); *H01G 4/1227* (2013.01); *H01G 4/30* (2013.01);
(Continued)

(58) Field of Classification Search
None
See application file for complete search history.

(56) References Cited

U.S. PATENT DOCUMENTS 8,873,219 B2  10/2014  Perea et al.
2014/0016242 A1  1/2014  Hattori et al.
(Continued)

FOREIGN PATENT DOCUMENTS

JP  2014-183173 A  9/2014
KR  10-2014-0020774 A  2/2014
(Continued)

OTHER PUBLICATIONS

Office Action issued in Korean Patent Application No. 10-2018-0120589 dated Sep. 11, 2019.
(Continued)

*Primary Examiner* — Dion Ferguson
(74) *Attorney, Agent, or Firm* — Morgan, Lewis & Bockius LLP

(57) ABSTRACT

A multilayer ceramic electronic component array includes a plurality of multilayer ceramic electronic components including a ceramic body including a dielectric layer and first and second internal electrodes, and first and second external electrodes, respectively; and an interposer including an insulating body disposed below the plurality of multilayer ceramic electronic components, a first terminal electrode disposed on the insulating body and connected to at least a portion of the respective first external electrodes of the plurality of multilayer ceramic electronic components, and a second terminal electrode disposed on the insulating body and connected to at least a portion of the respective second external electrodes of the plurality of multilayer ceramic electronic components. The first external electrodes of the plurality of multilayer ceramic electronic components are in electrical contact with each other, and the second external
(Continued)

electrodes of the plurality of multilayer ceramic electronic components are in electrical contact with each other.

18 Claims, 9 Drawing Sheets

(51) Int. Cl.
*H01G 4/008* (2006.01)
*H05K 1/18* (2006.01)
*H05K 1/02* (2006.01)
*H01G 4/12* (2006.01)

(52) U.S. Cl.
CPC .......... *H05K 1/0231* (2013.01); *H05K 1/181* (2013.01); *H05K 2201/10015* (2013.01); *H05K 2201/10522* (2013.01)

(56) References Cited

U.S. PATENT DOCUMENTS

| | | |
|---|---|---|
| 2014/0043723 A1 | 2/2014 | Hattori et al. |
| 2014/0124256 A1* | 5/2014 | Hattori .................. H01G 2/065 |
| | | 174/260 |
| 2015/0131202 A1 | 5/2015 | Masuda et al. |
| 2016/0088735 A1 | 3/2016 | Park et al. |
| 2016/0211075 A1 | 7/2016 | Park |
| 2016/0309578 A1 | 10/2016 | Park |
| 2017/0099727 A1 | 4/2017 | Son |
| 2018/0096794 A1 | 4/2018 | Morita et al. |

FOREIGN PATENT DOCUMENTS

| | | |
|---|---|---|
| KR | 10-2016-0089736 A | 7/2016 |
| KR | 10-2017-0039390 A | 4/2017 |

OTHER PUBLICATIONS

Notice of Allowance issued in related U.S. Appl. No. 16/203,381 dated Jun. 14, 2019.

Office Action issued in related U.S. Appl. No. 16/203,381 dated Feb. 7, 2019.

* cited by examiner

MULTILAYER CERAMIC ELECTRONIC COMPONENT ARRAY

CROSS-REFERENCE TO RELATED APPLICATION(S)

This application is a continuation application of U.S. patent application Ser. No. 16/203,381 filed Nov. 28, 2018, which claims the benefit of Korean Application No. 10-2018-0120589 filed on Oct. 10, 2018 in the Korean Intellectual Property Office, the entire contents of each of which are hereby incorporated by reference.

TECHNICAL FIELD

The present disclosure relates to a multilayer ceramic electronic component array.

BACKGROUND

Multilayer ceramic electronic components are commonly used as information technology (IT) components such as computers, PDAs, cellular phones, and the like because they may have a small size, may secure high capacity, and may be easily mounted.

The multilayer ceramic electronic component may cause acoustic noise due to a piezoelectric phenomenon occurring therein. Such acoustic noise maybe propagated to a substrate, which may cause noise perceptible to humans.

SUMMARY

An aspect of the present disclosure may provide a multilayer ceramic electronic component array capable of reducing acoustic noise.

According to an aspect of the present disclosure, a multilayer ceramic electronic component array includes a plurality of multilayer ceramic electronic components including a ceramic body including a dielectric layer and first and second internal electrodes stacked to be alternately exposed to first and second external surfaces of the ceramic body while having the dielectric layer interposed therebetween, and first and second external electrodes disposed on the first and second external surfaces of the ceramic body so as to be electrically connected to the first and second internal electrodes, respectively; and an interposer including an insulating body disposed below the plurality of multilayer ceramic electronic components, a first terminal electrode disposed on the insulating body and connected to at least a portion of the first external electrodes of the plurality of multilayer ceramic electronic components, and a second terminal electrode disposed on the insulating body and connected to at least a portion of the second external electrodes of the plurality of multilayer ceramic electronic components. The first external electrodes of the plurality of multilayer ceramic electronic components are in contact with each other, and the second external electrodes of the plurality of multilayer ceramic electronic components are in contact with each other.

According to another aspect of the present disclosure, a multilayer ceramic electronic component array includes a plurality of multilayer ceramic electronic components including a ceramic body including a dielectric layer and first and second internal electrodes stacked to be alternately exposed to first and second external surfaces of the ceramic body while having the dielectric layer interposed therebetween, and first and second external electrodes disposed on the first and second external surfaces of the ceramic body so as to be electrically connected to the first and second internal electrodes, respectively; an interposer including an insulating body disposed below the plurality of multilayer ceramic electronic components, a first terminal electrode disposed on the insulating body and connected to at least a portion of the respective first external electrodes of the plurality of multilayer ceramic electronic components, and a second terminal electrode disposed on the insulating body and connected to at least a portion of the respective second external electrodes of the plurality of multilayer ceramic electronic components; and an insulating member disposed between adjacent ones of the plurality of multilayer ceramic electronic components and in contact with the ceramic body of each of the adjacent multilayer ceramic electronic components and being more flexible than the dielectric layer.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
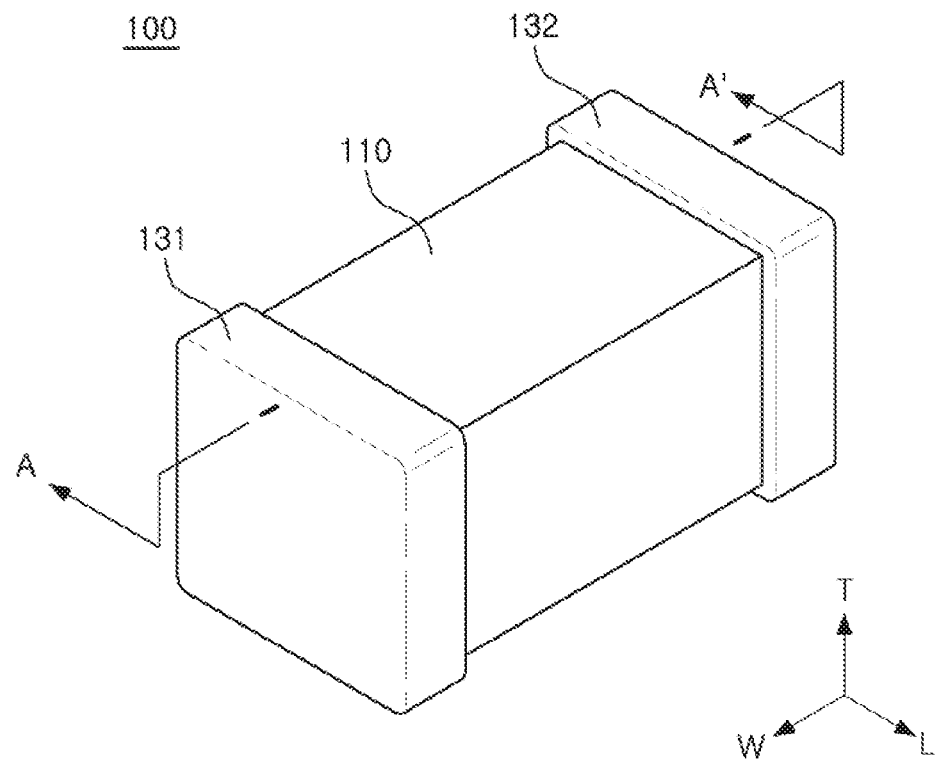
FIG. 1 is a perspective view illustrating a multilayer ceramic electronic component included in a multilayer ceramic electronic component array according to an exemplary embodiment in the present disclosure.

Hereinafter, exemplary embodiments of the present disclosure will now be described in detail with reference to the accompanying drawings.

Directions of a hexahedron will be defined in order to clearly describe exemplary embodiments in the present disclosure. L, W and T illustrated in the drawings refer to a length direction, a width direction, and a thickness direction, respectively. Here, the thickness direction refers to a stacking direction in which dielectric layers are stacked.

A multilayer ceramic electronic component according to an exemplary embodiment in the present disclosure, particularly, a multilayer ceramic capacitor will hereinafter be described. However, the multilayer ceramic electronic component according to the present disclosure is not limited thereto.

FIG. 1 is a perspective view illustrating a multilayer ceramic electronic component included in a multilayer ceramic electronic component array according to an exemplary embodiment in the present disclosure.

Referring to FIG. 1, a multilayer ceramic electronic component 100 may include a ceramic body 110, and first and second external electrodes 131 and 132.

The ceramic body 110 maybe formed of a hexahedron having both end surfaces in a length direction L, both side surfaces in a width direction W, and both side surfaces in a thickness direction T. The ceramic body 110 may be formed by stacking a plurality of dielectric layers in the thickness direction T and then sintering the plurality of dielectric layers. A shape and a dimension of the ceramic body 1 and the number (one or more) of stacked dielectric layers are not limited to those of an example illustrated in the present exemplary embodiment.

The plurality of dielectric layers disposed in the ceramic body 110 may be in a sintered state, and adjacent dielectric layers may be integrated with each other so that boundaries therebetween are not readily apparent without using a scanning electron microscope (SEM).

For example, the ceramic body 110 may have eight rounded corners in the hexahedron. Accordingly, durability and reliability of the ceramic body 110 may be improved, and structural reliability of the first and second external electrodes 131 and 132 at the corners may be improved.

The dielectric layer 111 may have a thickness arbitrarily changed in accordance with a capacitance design of the multilayer ceramic electronic component 100, and may include ceramic powders having a high dielectric constant, such as barium titanate ($BaTiO_3$) based powders or strontium titanate ($SrTiO_3$) based powders. However, a material of the dielectric layer according to the present disclosure is not limited thereto. In addition, various ceramic additives, organic solvents, plasticizers, binders, dispersants, and the like, may be added to the ceramic powders according to an object of the present disclosure.

An average particle size of the ceramic powders used to form the dielectric layer is not particularly limited, but may be controlled in order to accomplish an object of the present disclosure. For example, the average particle size of the ceramic powders used to form the dielectric layer may be controlled to be 400 nm or less. Accordingly, the multilayer ceramic electronic component 100 may be used as a component that greatly requires miniaturization and high capacity like an IT component.

For example, the dielectric layer may be formed by applying and drying a slurry including powders such as barium titanate ($BaTiO_3$) powders, or the like onto a carrier film to prepare a plurality of ceramic sheets. The ceramic sheets may be manufactured by mixing ceramic powders, a binder, and a solvent with each other to prepare a slurry and manufacturing the slurry in a sheet shape having a thickness of several micrometers by a doctor blade method, but is not limited thereto.

The first and second external electrodes 131 and 132 may be disposed on first and second external surfaces of the body 110 (e.g., one end surface and the other end surface of the body 110 in the length direction of the body 110) so as to be connected to the first and second internal electrodes, respectively, and may electrically connect between the first and second internal electrodes and the substrate.

For example, the first and second external electrodes 131 and 132 may be formed of copper (Cu), palladium (Pd), platinum (Pt), gold (Au), silver (Ag), lead (Pb), or the like, or alloys thereof.

For example, the first and second external electrodes 131 and 132 may include first and second electrode layers including copper (Cu) or nickel (Ni), and first and second plating layers disposed on the first and second electrode layers and including nickel (Ni) or tin (Sn).

The first and second electrode layers may be formed by a method performing a dipping in a paste including metal components, or a method of printing a conductive paste including a conductive metal on at least one surface of the ceramic body 110 in the thickness direction T of the ceramic body 110, and may also be formed by a sheet transfer manner and a pad transfer manner.

The first and second plating layers may be formed according to sputtering or electric deposition, but are not limited thereto.

Figure 2:
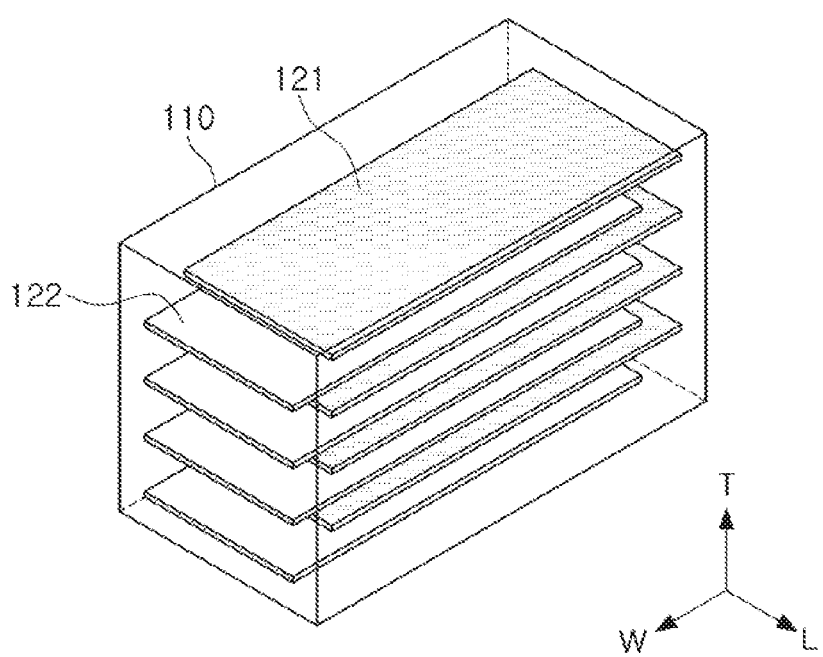
FIG. 2 is a perspective view illustrating a form of internal electrodes of the multilayer ceramic electronic component illustrated in FIG. 1.

FIG. 2 is a perspective view illustrating a form of internal electrodes of the multilayer ceramic electronic component illustrated in FIG. 1.

Referring to FIG. 2, the ceramic body 110 may include the first and second internal electrodes 121 and 122, and include the dielectric layer disposed between the first and second internal electrodes 121 and 122.

The first and second internal electrodes 121 and 122 may be stacked to be alternatively exposed to the first and second external surfaces of the ceramic body (e.g., one end surface and the other end surface of the ceramic body in the length direction of the ceramic body) while having the dielectric layer interposed therebetween to have different polarities.

The first internal electrodes 121 and the second internal electrodes 122 maybe formed to be alternately exposed to one end surface and the other end surface of the ceramic body 110 in the length direction L of the ceramic body 110 in a stacking direction of the dielectric layers by printing a conductive paste including a conductive metal, and may be electrically insulated from each other by the dielectric layer disposed therebetween.

That is, the first and second internal electrodes 121 and 122 may be electrically connected to the first and second external electrodes 131 and 132 formed on both end surfaces of the ceramic body 110 in the length direction L of the ceramic body 110 through portions alternately exposed to both end surfaces of the ceramic body 110 in the length direction of the ceramic body 110, respectively.

For example, the first and second internal electrodes 121 and 122 may be formed by the conductive paste for an internal electrode including conductive metal powders having a particle average size of 0.1 to 0.2 μm and a weight of 40 to 50 wt %.

The conductive paste for an internal electrode may be applied onto the ceramic sheets by a printing method, or the like, to form internal electrode patterns. A method of printing the conductive paste may be a screen printing method, a gravure printing method, or the like, but is not limited thereto. Two hundred or three hundred ceramic sheets on which the internal electrode patterns are printed may be stacked, pressed, and sintered to manufacture the ceramic body 110.

Therefore, when a voltage is applied to the first and second external electrodes 131 and 132, electrical charges may be accumulated between the first and second internal electrodes 121 and 122 facing each other. In this case, a capacitance of the multilayer ceramic electronic component 100 may be proportional to an area of a region in which the first and second internal electrodes 121 and 122 overlap each other.

That is, when the area of the region in which the first and second internal electrodes 121 and 122 overlap each other is significantly increased, capacitance may be significantly increased, even in a capacitor having the same size.

A thickness of each of the first and second internal electrodes 121 and 122 may be determined depending on the use, and may be, for example, 0.4 µm or less. In addition, the number of layers of the first and second internal electrodes 121 and 122 may be 400 or more. Accordingly, the multilayer ceramic electronic component 100 may be used as a component that greatly requires miniaturization and high capacity like an IT component.

Since the thickness of the dielectric layer corresponds to an interval between the first and second internal electrodes 121 and 122, the capacitance of the multilayer ceramic electronic component 100 may be large as the thickness of the dielectric layer is shorter.

The conductive metal included in the conductive paste forming the first and second internal electrodes 121 and 122 may be nickel (Ni), copper (Cu), palladium (Pd), silver (Ag), lead (Pb), or platinum (Pt), or alloys thereof. However, the conductive metal according to the present disclosure is not limited thereto.

The withstand voltage characteristic of the ceramic body 110 may be improved as the interval between the first and second internal electrodes 121 and 122 is longer.

In a case in which the multilayer ceramic electronic component 100 is required to have a high withstand voltage characteristic such as electric parts, the multilayer ceramic electronic component 100 may be designed so that an average thickness of the dielectric layers exceeds twice an average thickness of the first and second internal electrodes 121 and 122. Accordingly, the multilayer ceramic electronic component 100 may have the high withstand voltage characteristic and may be used as the electric part.

In addition, durability (e.g., warpage endurance) of the ceramic body 110 may have high reliability in a case in which a width of the ceramic body 110 exceeds 0.5 times the thickness thereof.

The capacitance of the multilayer ceramic electronic component 100 may be increased as the number of stacked layers of the first and second internal electrodes 121 and 122 and the overlap region of the first and second internal electrodes 121 and 122 are larger. The number of stacked layers of the first and second internal electrodes 121 and 122 may be increased as the thickness of the electronic component is increased, and the overlap area of the first and second internal electrodes 121 and 122 may be increased as the length and/or width of the multilayer ceramic electronic component is increased. Therefore, the capacitance of the multilayer ceramic electronic component 100 may be dependent on a size thereof.

However, as the size of the multilayer ceramic electronic component 100 increased, the possibility of a defect occurring in a process of manufacturing the multilayer ceramic electronic component 100 may be increased.

For example, as the size of the multilayer ceramic electronic component 100 is increased, the multilayer ceramic electronic component 100 may be subjected to more stress in a process of cutting the multilayer ceramic electronic component 100, and internal burn-out may be caused according to an internal sintering imbalance when the multilayer ceramic electronic component 100 is sintered.

Figure 3A:
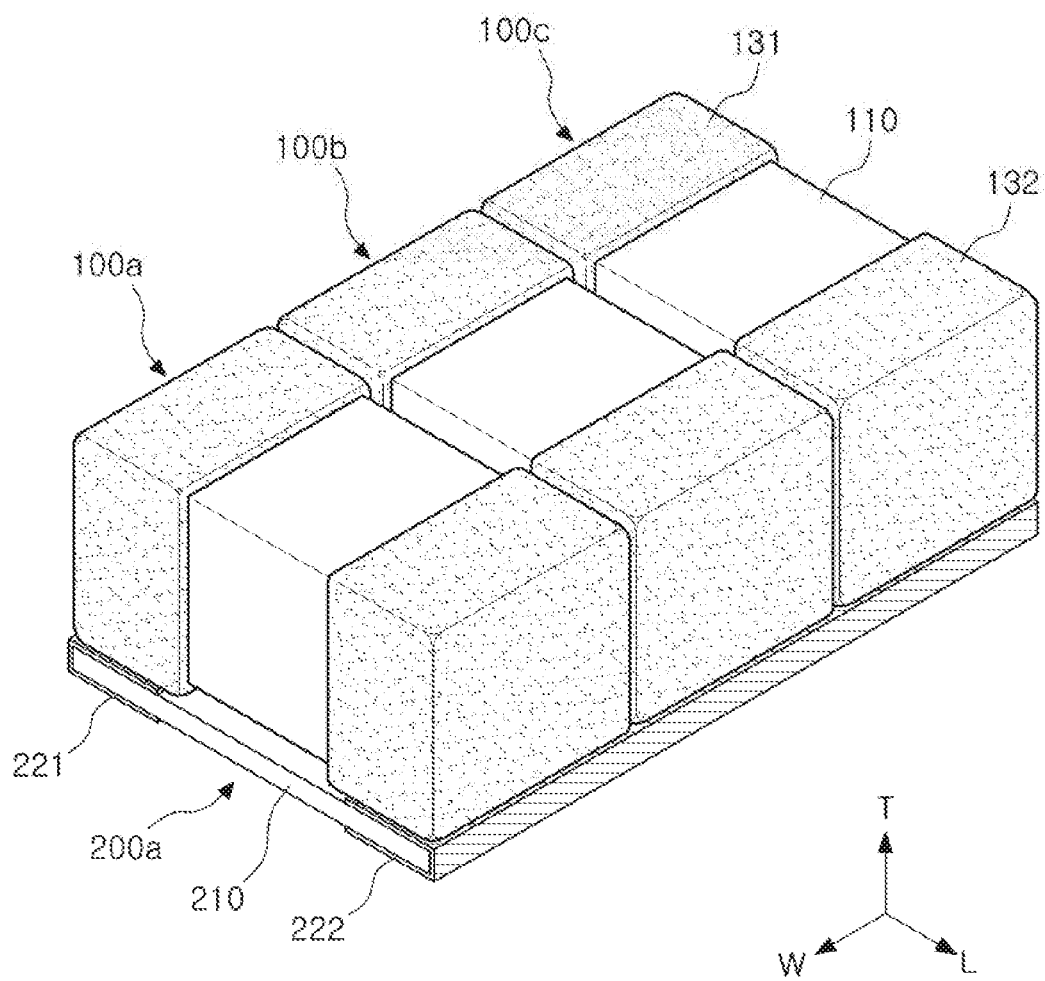
FIG. 3A is a perspective view illustrating a multilayer ceramic electronic component array according to an exemplary embodiment in the present disclosure.

FIG. 3A is a perspective view illustrating a multilayer ceramic electronic component array according to an exemplary embodiment in the present disclosure.

Referring to FIG. 3A, a multilayer ceramic electronic component array according to an exemplary embodiment in the present disclosure may include a plurality of multilayer ceramic electronic components 100a, 100b, and 100c, and an interposer 200a.

That is, one multilayer ceramic electronic component may be divided into the plurality of multilayer ceramic electronic components 100a, 100b, and 100c. Accordingly, the multilayer ceramic electronic component array according to an exemplary embodiment in the present disclosure may reduce a defect in a process of manufacturing thereof while having a high capacitance.

The plurality of multilayer ceramic electronic components 100a, 100b, and 100c may be designed in the same manner as the multilayer ceramic electronic component illustrated in FIGS. 1 and 2.

The interposer 200a may provide an arrangement space of the plurality of multilayer ceramic electronic components 100a, 100b, and 100c, and include an insulating body 210, and first and second terminal electrodes 221 and 222.

In addition, the interposer 200a may attenuate acoustic noise while suppressing a transmission of the acoustic noise that may occur in the plurality of multilayer ceramic electronic components 100a, 100b, and 100c to the substrate below the interposer 200a. Accordingly, the acoustic noise may be reduced.

For example, the insulating body 210 maybe implemented of the same material as that of an insulating layer of a printed circuit board (PCB), and may be implemented with high Young's modulus such as alumina to efficiently reduce the acoustic noise of the plurality of multilayer ceramic electronic components 100a, 100b, and 100c.

The first and second terminal electrodes 221 and 222 may electrically connect between the substrate below thereof and the plurality of multilayer ceramic electronic components 100a, 100b, and 100c. That is, the first and second terminal electrodes 221 and 222 may be electrically connected to the first and second external electrodes 131 and 132, respectively.

Figure 3B:
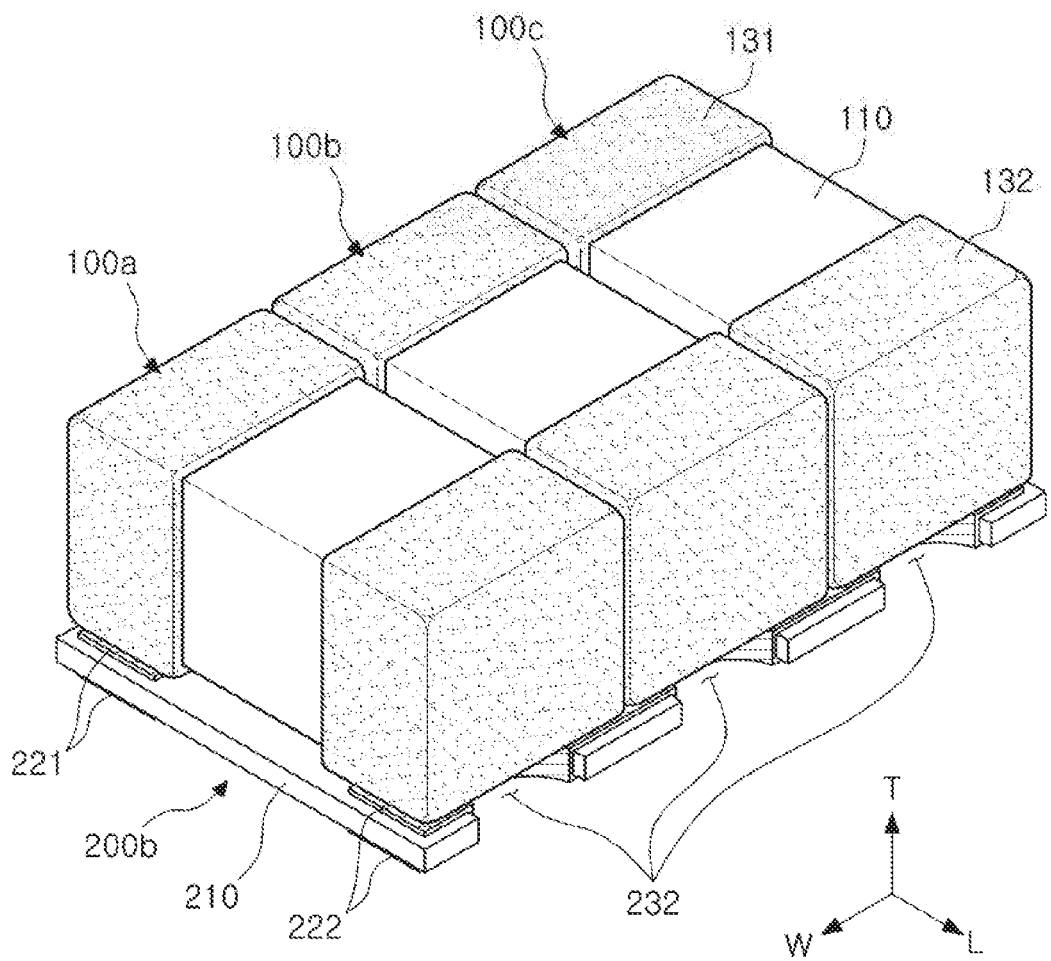
FIG. 3B is a perspective view illustrating a form in which a recessed region is added in the multilayer ceramic electronic component array according to an exemplary embodiment in the present disclosure.

FIG. 3B is a perspective view illustrating a form in which a recessed region is added in the multilayer ceramic electronic component array according to an exemplary embodiment in the present disclosure.

Referring to FIG. 3B, the interposer 200b may include first recessed regions and second recessed regions 232 positioned on an end surface of the insulating body 210 in a length direction thereof. That is, the first and second terminal electrodes 221 and 222 may include the first recessed regions and the second recessed regions 232, respectively.

The first recessed regions and the second recessed regions may be spaces in which at least a portion of the solder may be disposed when the multilayer ceramic electronic component array is mounted on the substrate. A ratio of a portion of the solder that rises to the side surfaces of the plurality of multilayer ceramic electronic components 100a, 100b, and 100c may be decreased as at least a portion of the solder is positioned in the first recessed regions and the second depression regions 232, Since the portion of the solder positioned on the side surfaces of the plurality of multilayer ceramic electronic components 100a, 100b, and 100c may act as a path of acoustic noise, the acoustic noise of the multilayer ceramic electronic component array may be more efficiently reduced as the ratio of the portion of the solder rising to the side surfaces of the plurality of multilayer ceramic electronic components 100a, 100b, and 100c is lower.

Figure 4A:
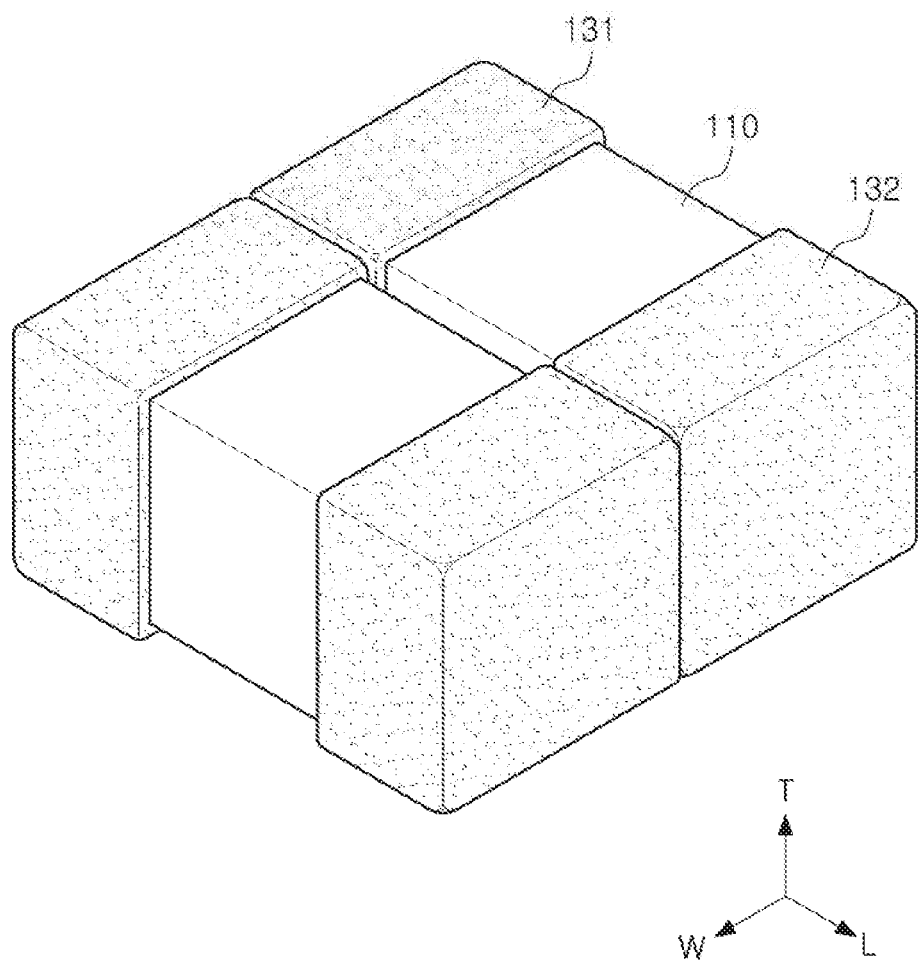
FIG. 4A is a perspective view illustrating an external electrode linkage of the multilayer ceramic electronic component.
Figure 4B:
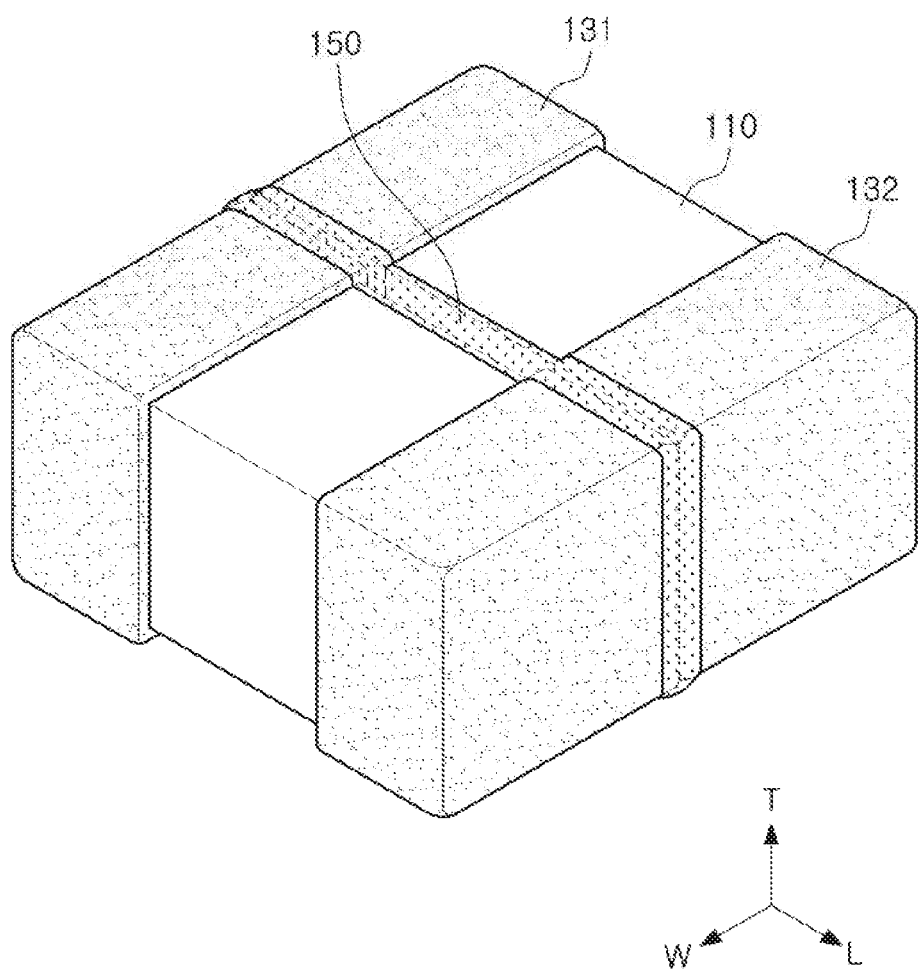
FIG. 4B is a perspective view illustrating an insulating member linkage of the multilayer ceramic electronic component.
Figure 4C:
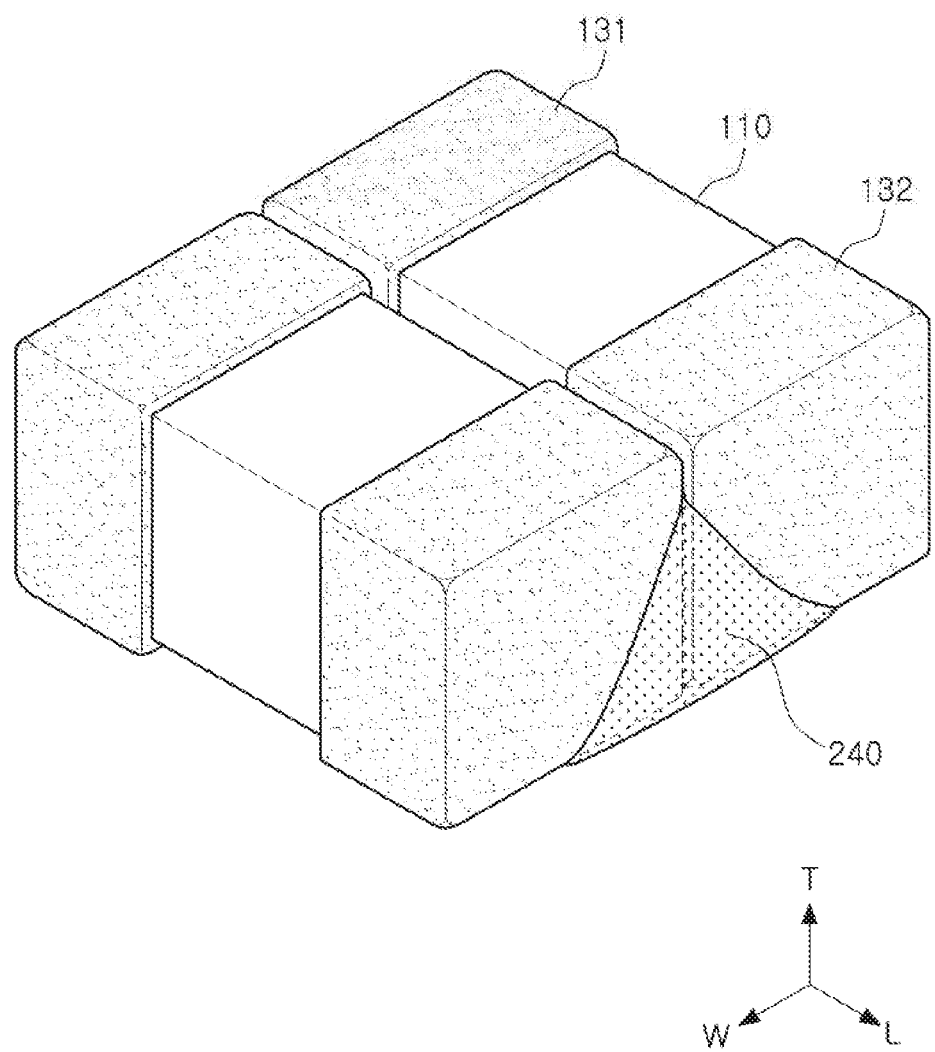
FIG. 4C is a perspective view illustrating a solder linkage of the multilayer ceramic electronic component.

Meanwhile, the multilayer ceramic electronic component array according to an exemplary embodiment in the present disclosure may efficiently reduce the acoustic noise by using at least one of linkage structures between the plurality of multilayer ceramic electronic components 100a, 100b, and 100c illustrated in FIGS. 4A through 4C.

FIG. 4A is a perspective view illustrating an external electrode linkage of the multilayer ceramic electronic component.

Referring to FIG. 4A, the respective first external electrodes 131 of the plurality of multilayer ceramic electronic components may be in contact with each other, and the respective second external electrodes 132 of the plurality of multilayer ceramic electronic components may be in contact with each other.

Accordingly, at least portions of the respective acoustic noises of the plurality of multilayer ceramic electronic components may be offset with each other, and fixing strength may be improved when the plurality of multilayer ceramic electronic components are mounted.

Table 1 below illustrates acoustic noise according to whether or not the first and second external electrodes 131 and 132 are in contact with each other. Here, a thickness of the interposer may be 0.2 mm, one multilayer ceramic electronic component may have a size of 1005, a capacitance of one multilayer ceramic electronic component may be 47 μF, and the internal electrodes and the interposer may be disposed to be perpendicular to each other.

TABLE 1

| Type | Average | Sample 1 | Sample 2 | Sample 3 | Sample 4 | Sample 5 |
|---|---|---|---|---|---|---|
| Single/Interposer Absence | 38.4 dB | 38.1 dB | 37.6 dB | 38.5 dB | 38.7 dB | 39.1 dB |
| External Electrodes Spaced Apart from Each Other | 31.8 dB | 32.0 dB | 33.5 dB | 31.1 dB | 31.7 dB | 30.8 dB |
| External Electrodes Bonded to Each Other | 29.5 dB | 29.5 dB | 30.2 dB | 29.6 dB | 28.9 dB | 29.5 dB |

Referring to Table 1, the multilayer ceramic electronic component array according to an exemplary embodiment in the present disclosure may have a structure in which the plurality of multilayer ceramic electronic components on the interposer are connected to each other through the contact of the first and second external electrodes, thereby reducing the acoustic noise.

Table 2 below illustrates fixing strength when the multilayer ceramic electronic components are mounted according to whether or not the first and second external electrodes 131 and 132 are in contact with each other. Here, the fixing strength refers to a reference force at which the multilayer ceramic electronic component is separated when a lateral force is applied to the multilayer ceramic electronic component. Experimental conditions are the same as in Table 1.

TABLE 2

| Type | Average | Sample 1 | Sample 2 | Sample 3 | Sample 4 | Sample 5 |
|---|---|---|---|---|---|---|
| Single/Interposer Absence | 13.3N | 12.8N | 13.5N | 15.4N | 10.9N | 13.7N |
| External Electrodes Spaced Apart from Each Other | 4.3N | 4.2N | 4.8N | 3.1N | 5.0N | 4.5N |
| External Electrodes Bonded to Each Other | 33.2N | 30.2N | 31.8N | 28.2N | 40.1N | 35.6N |

Referring to Table 2, the multilayer ceramic electronic component array according to an exemplary embodiment in the present disclosure may have a structure in which the plurality of multilayer ceramic electronic components on the interposer are connected to each other through the contact of the first and second external electrodes, thereby improving the fixing strength.

FIG. 4B is a perspective view illustrating an insulating member linkage of the multilayer ceramic electronic component.

Referring to FIG. 4B, the multilayer ceramic electronic component array according to an exemplary embodiment in the present disclosure may further include an insulating member 150 which is contact with the ceramic body 110 of each of the plurality of multilayer ceramic electronic components and is more flexible than the ceramic body 110 and/or the dielectric layer.

Accordingly, the respective acoustic noises of the plurality of multilayer ceramic electronic components may be more efficiently offset.

For example, the insulating member 150 may include an epoxy to more efficiently offset the respective acoustic noises of the plurality of multilayer ceramic electronic components, but is not limited thereto.

Table 3 below illustrates the acoustic noise according to the presence or absence of the insulating member 150. Here, the insulating member 150 may be an epoxy, and the first and second external electrodes 131 and 132 may be bonded to each other. The remaining experimental conditions are the same as in Table 1.

TABLE 3

| Type | Average | Sample 1 | Sample 2 | Sample 3 | Sample 4 | Sample 5 |
|---|---|---|---|---|---|---|
| Single/Interposer Absence | 38.4 dB | 38.1 dB | 37.6 dB | 38.5 dB | 38.7 dB | 39.1 dB |
| Insulating Member Absence | 29.5 dB | 29.5 dB | 30.2 dB | 29.6 dB | 28.9 dB | 29.5 dB |

TABLE 3-continued

| Type | Average | Sample 1 | Sample 2 | Sample 3 | Sample 4 | Sample 5 |
|---|---|---|---|---|---|---|
| Insulating Member Presence | 26.8 dB | 26.4 dB | 27.1 dB | 27.4 dB | 26.8 dB | 26.5 dB |

Referring to Table 3, the multilayer ceramic electronic component array according to an exemplary embodiment in the present disclosure may include the insulating member 150, thereby further reducing the acoustic noise.

Table 4 below illustrates the fixing strength when the ceramic electronic component is mounted according to the presence or absence of the insulating member 150. Experimental conditions are the same as in Table 3.

TABLE 4

| Type | Average | Sample 1 | Sample 2 | Sample 3 | Sample 4 | Sample 5 |
|---|---|---|---|---|---|---|
| Single/Interposer Absence | 13.3N | 12.8N | 13.5N | 15.4N | 10.9N | 13.7N |
| Insulating Member Absence | 29.8N | 30.2N | 31.8N | 28.2N | 27.1N | 31.6N |
| Insulating Member Presence | 34.1N | 31.7N | 30.9N | 33.7N | 35.4N | 38.7N |

Referring to Table 4, the multilayer ceramic electronic component array according to an exemplary embodiment in the present disclosure may include the insulating member 150, thereby further improving the fixing strength.

FIG. 4C is a perspective view illustrating a solder linkage of the multilayer ceramic electronic component.

Referring to FIG. 4C, the multilayer ceramic electronic component array according to an exemplary embodiment in the present disclosure may further include a first solder and a second solder 240.

The first solder may be in contact with the first terminal electrode, and at least a portion thereof may be positioned between the respective first external electrodes 131 of the plurality of multilayer ceramic electronic components.

The second solder 240 may be in contact with the second terminal electrode, and at least a portion thereof may be positioned between the respective second external electrodes 132 of the plurality of multilayer ceramic electronic components.

Here, the insulating member illustrated in FIG. 4B may be disposed to be in contact with the first solder and the second solder 240.

Accordingly, since the insulating member 150 may be linkaged with the first solder and the second solder 240, the insulating member 150 may more efficiently reduce the acoustic noise.

Figure 5A:
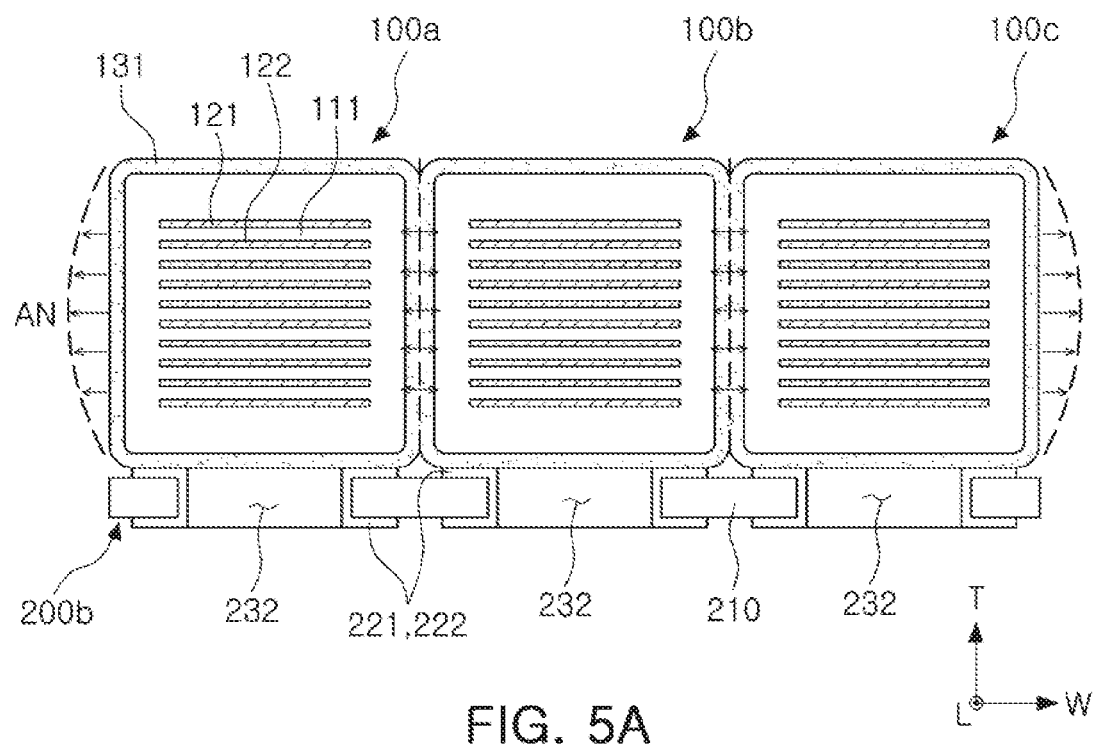
FIGS. 5A, and 5B are side views illustrating different structures of internal electrodes of the multilayer ceramic electronic component array according to other exemplary embodiments in the present disclosure.
Figure 5B:
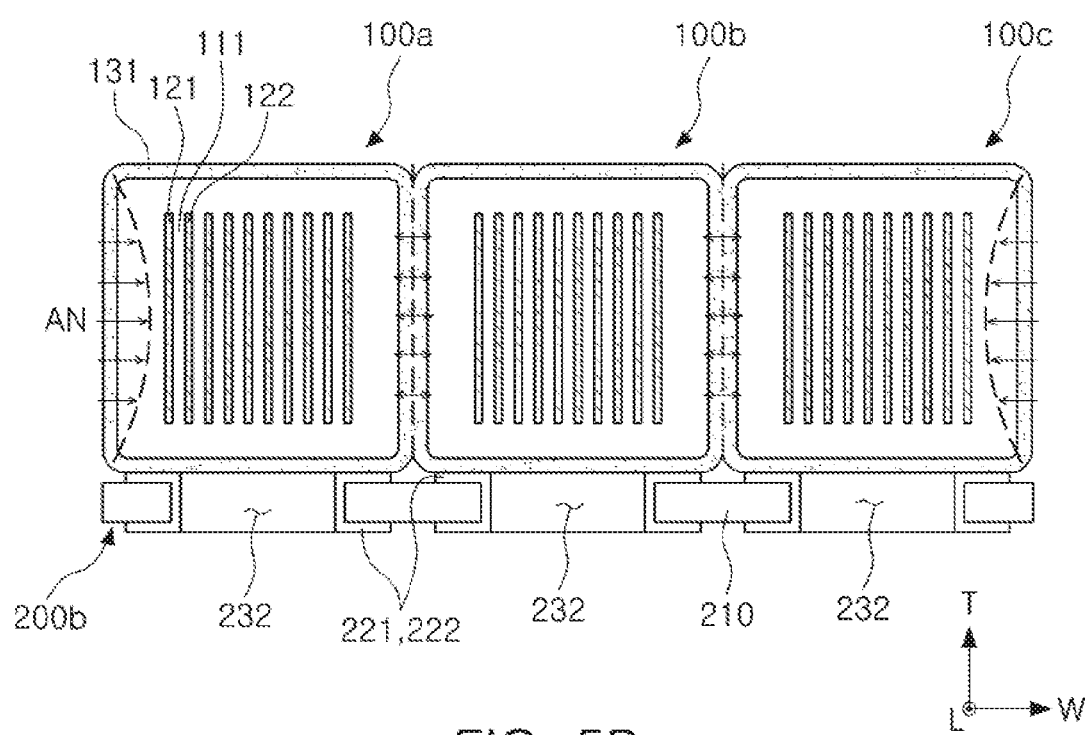

FIGS. 5A and 5B are side views illustrating a parallel structure of internal electrodes of the multilayer ceramic electronic component array according to an exemplary embodiment in the present disclosure.

Referring to FIGS. 5A and 5B, the respective first internal electrodes 121 of the plurality of multilayer ceramic electronic components may be disposed to be in parallel to each other, and the respective second internal electrodes 122 of the plurality of multilayer ceramic electronic components may be disposed to be in parallel to each other.

As shown in FIG. 5A, the first second internal electrodes 121 and 122 may be disposed to be parallel to a mounting surface of the interposer 200b.

As shown in FIG. 5B, the first and second internal electrodes 121 and 122 may be disposed to be perpendicular to a mounting surface of the interposer 200b.

Accordingly, since the respective acoustic noises AN may have displacements opposite to each other, the acoustic noises may be efficiently offset with each other.

FIGS. 6A through 6D are perspective views illustrating various forms of an interposer included in the multilayer ceramic electronic component array according to an exemplary embodiment in the present disclosure.

Figure 6A:
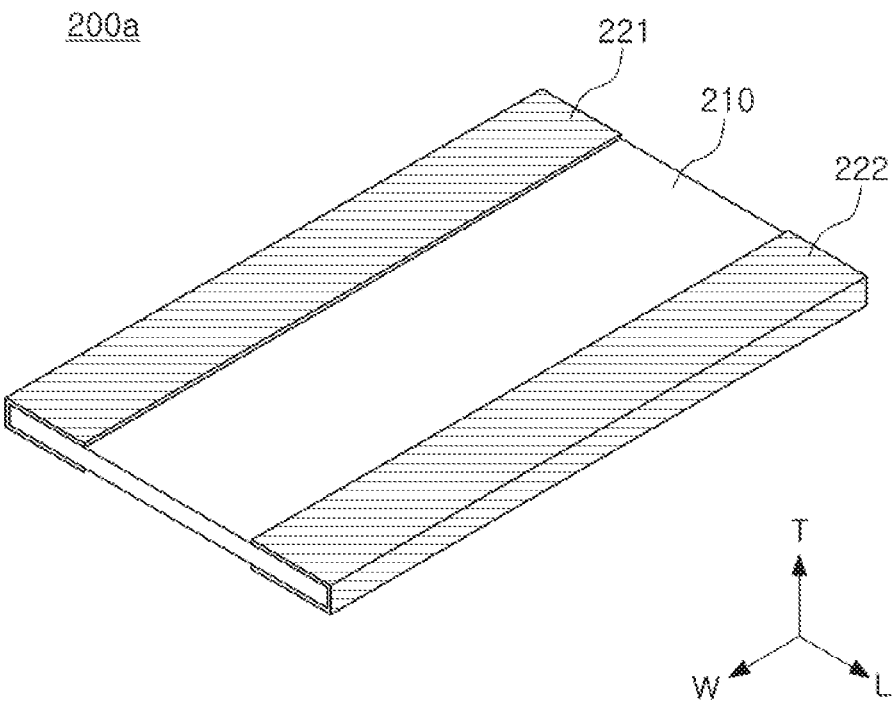
FIGS. 6A through 6D are perspective views illustrating various forms of an interposer included in the multilayer ceramic electronic component array according to an exemplary embodiment in the present disclosure.

Referring to FIG. 6A, an interposer 200a may have neither a recessed region nor a groove.

Figure 6B:
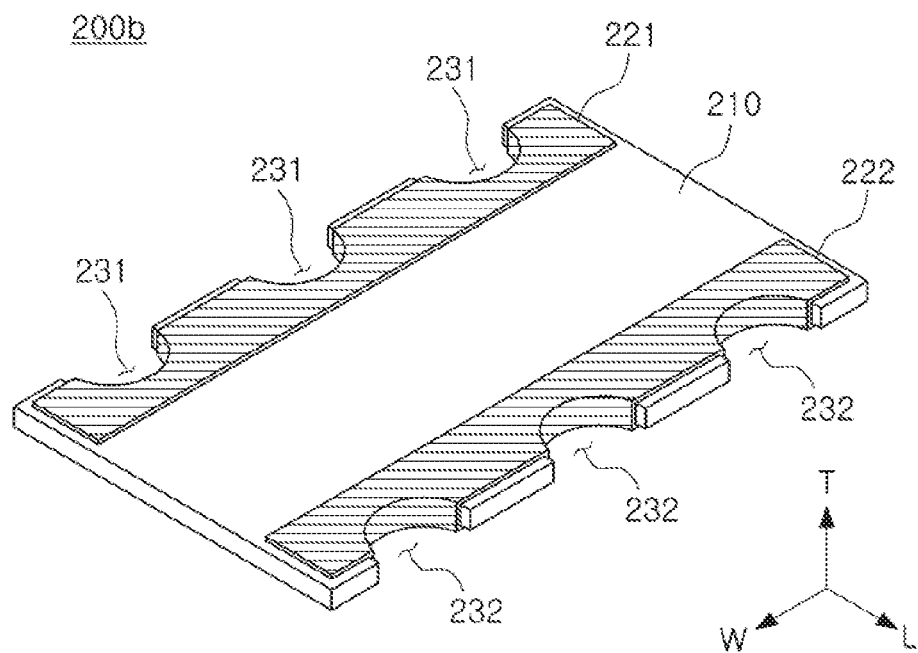

Referring to FIG. 6B, an interposer 200b may have only first and second recessed regions 231 and 232 among the first and second recessed regions 231 and 232 and the groove.

Figure 6C:
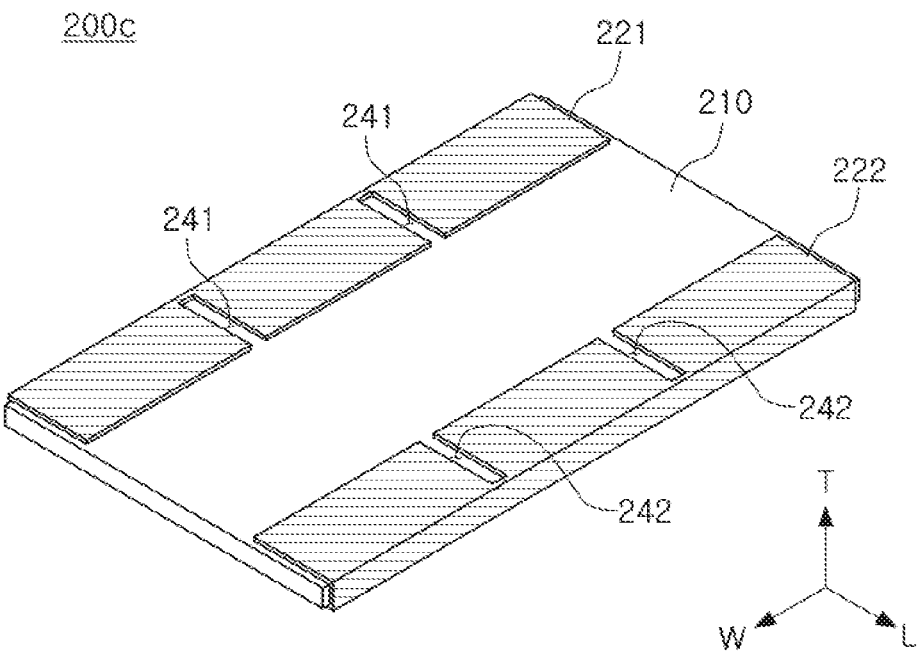

Referring to FIG. 6C, an interposer 200c may have only first and second grooves 241 and 242 among the recessed region and the first and second grooves 241 and 242.

Figure 6D:
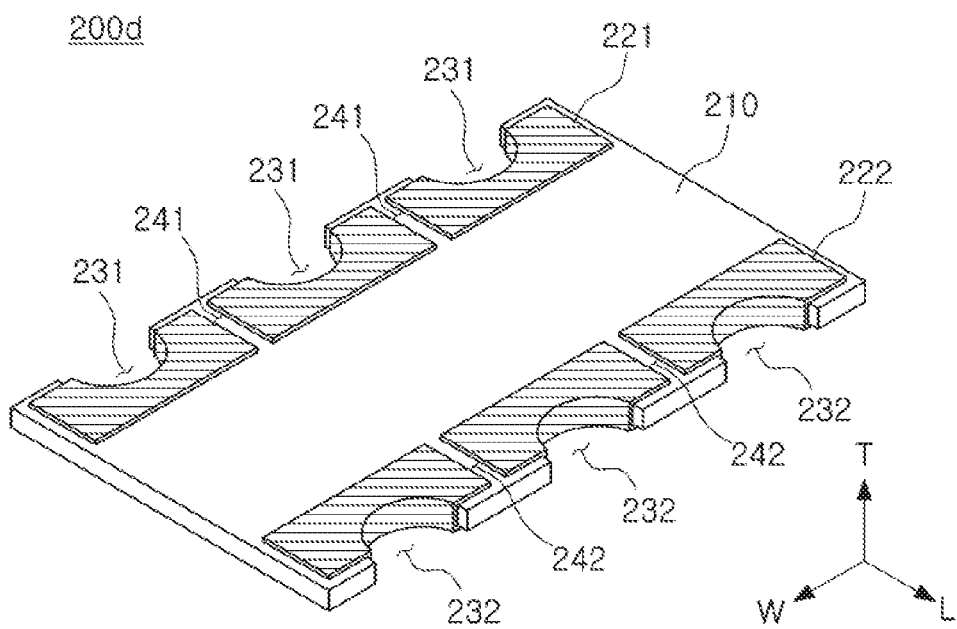

Referring to FIG. 6D, an interposer 200d may have both the first and second recessed regions 231 and 232 and the first and second grooves 241 and 242.

The first and second grooves 241 and 242 may be positioned between the plurality of multilayer ceramic electronic components on an upper surface of the insulating body 210.

Accordingly, since a portion of the solder may be filled in the first and second grooves 241 and 242, the ratio of the portion of the solder rising up to the side surfaces of the plurality of multilayer ceramic electronic components may be reduced. Therefore, the acoustic noise may be further reduced.

In addition, a contact area between the solder and the insulating member may be increased as a portion of the solder is filled in the first and second grooves 241 and 242. Therefore, the acoustic noise may be more efficiently offset.

As set forth above, according to the exemplary embodiment in the present disclosure, the multilayer ceramic electronic component array may secure large capacitance, reduce the acoustic noise, and have strong fixing strength for the substrate.

While exemplary embodiments have been shown and described above, it will be apparent to those skilled in the art that modifications and variations could be made without departing from the scope of the present invention as defined by the appended claims.

What is claimed is:

1. A multilayer ceramic electronic component array comprising:
    a plurality of multilayer ceramic electronic components including a ceramic body including a dielectric layer and first and second internal electrodes stacked to be alternately exposed to first and second external surfaces of the ceramic body while having the dielectric layer interposed therebetween, and first and second external electrodes disposed on the first and second external surfaces of the ceramic body so as to be electrically connected to the first and second internal electrodes, respectively; and
    an interposer including an insulating body disposed below the plurality of multilayer ceramic electronic components, a first terminal electrode disposed on the insulating body and electrically connected to at least a portion of the first external electrodes of the plurality of multilayer ceramic electronic components, and a second terminal electrode disposed on the insulating body and electrically connected to at least a portion of the second external electrodes of the plurality of multilayer ceramic electronic components, wherein the at least a portion of each of the first external electrodes of the plurality of multilayer ceramic electronic components are in direct contact with an adjacent first external electrode of the plurality of multilayer ceramic electronic components, the at least a portion of each of the second external electrodes of the plurality of multilayer ceramic electronic components are in direct contact with an adjacent second external electrode of the plurality of multilayer ceramic electronic components, the insulating body has a plurality of first recessed regions positioned below the first external electrodes, respectively, the insulating body has a plurality of second recessed regions positioned below the second external electrodes, respectively, the first terminal electrode includes first grooves each positioned between adjacent recessed regions of the plurality of first recessed regions and disposed on a first surface of the insulating body on which the plurality of multilayer ceramic electronic components are disposed, and the second terminal electrode includes second grooves each positioned between adjacent recessed regions of the plurality of second recessed regions and disposed on the first surface of the insulating body.

2. The multilayer ceramic electronic component array of claim 1, further comprising an insulating member disposed between adjacent ones of the plurality of multilayer ceramic electronic components and in contact with the ceramic body of each of the adjacent multilayer ceramic electronic components and being more flexible than the dielectric layer.

3. The multilayer ceramic electronic component array of claim 2, wherein the insulating member includes an epoxy.

4. The multilayer ceramic electronic component array of claim 3, wherein the first internal electrodes of the plurality of multilayer ceramic electronic components are disposed to be in parallel to each other, and the second internal electrodes of the plurality of multilayer ceramic electronic components are disposed to be in parallel to each other.

5. The multilayer ceramic electronic component array of claim 4, wherein the first and second internal electrodes are disposed to be parallel to a mounting surface of the interposer.

6. The multilayer ceramic electronic component array of claim 4, wherein the first and second internal electrodes are disposed to be perpendicular to a mounting surface of the interposer.

7. The multilayer ceramic electronic component array of claim 1, wherein the at least a portion of the first terminal electrode is disposed in the plurality of first recessed regions, and the at least a portion of the second terminal electrode is disposed in the plurality of second recessed regions.

8. The multilayer ceramic electronic component array of claim 7, wherein the first terminal electrode comprises a plurality of first terminal electrodes electrically connected to the first external electrodes, respectively, and the second terminal electrode comprises a plurality of second terminal electrodes electrically connected to the second external electrodes, respectively.

9. A multilayer ceramic electronic component array comprising:
a plurality of multilayer ceramic electronic components including a ceramic body including a dielectric layer and first and second internal electrodes stacked to be alternately exposed to first and second external surfaces of the ceramic body while having the dielectric layer interposed therebetween, and first and second external electrodes disposed on the first and second external surfaces of the ceramic body so as to be electrically connected to the first and second internal electrodes, respectively;
an interposer including an insulating body disposed below the plurality of multilayer ceramic electronic components, a first terminal electrode disposed on the insulating body and electrically connected to at least a portion of the respective first external electrodes of the plurality of multilayer ceramic electronic components, and a second terminal electrode disposed on the insulating body and electrically connected to at least a portion of the respective second external electrodes of the plurality of multilayer ceramic electronic components; and
an insulating member disposed between adjacent ones of the plurality of multilayer ceramic electronic components and in contact with the ceramic body of each of the adjacent multilayer ceramic electronic components and being more flexible than the dielectric layer,
wherein the insulating body has a plurality of first recessed regions positioned below the first external electrodes, respectively,
the insulating body has a plurality of second recessed regions positioned below the second external electrodes, respectively,
the first terminal electrode includes first grooves each positioned between adjacent recessed regions of the plurality of first recessed regions and disposed on a first surface of the insulating body on which the plurality of multilayer ceramic electronic components are disposed, and
the second terminal electrode includes second grooves each positioned between adjacent recessed regions of the plurality of second recessed regions and disposed on the first surface of the insulating body.

10. The multilayer ceramic electronic component array of claim 9, further comprising:
a first solder which is in contact with the first terminal electrode and having at least a portion positioned between the respective first external electrodes of the plurality of multilayer ceramic electronic components; and
a second solder which is in contact with the second terminal electrode and having at least a portion positioned between the respective second external electrodes of the plurality of multilayer ceramic electronic components.

11. The multilayer ceramic electronic component array of claim 10, wherein the first insulating member and the first and second solders are in contact with each other between the plurality of multilayer ceramic electronic components.

12. The multilayer ceramic electronic component array of claim 9, wherein the insulating member includes an epoxy.

13. The multilayer ceramic electronic component array of claim 9, wherein the first and second internal electrodes are disposed to be parallel to a mounting surface of the interposer.

14. The multilayer ceramic electronic component array of claim 9, wherein the first and second internal electrodes are disposed to be perpendicular to a mounting surface of the interposer.

15. The multilayer ceramic electronic component array of claim 9, wherein the at least a portion of the first terminal electrode is disposed in the plurality of first recessed regions, and the at least a portion of the second terminal electrode is disposed in the plurality of second recessed regions.

16. The multilayer ceramic electronic component array of claim 15, wherein the first terminal electrode comprises a plurality of first terminal electrodes electrically connected to the first external electrodes, respectively, and the second terminal electrode comprises a plurality of second terminal electrodes electrically connected to the second external electrodes, respectively.

17. A multilayer ceramic electronic component array comprising:

a plurality of multilayer ceramic electronic components including a ceramic body including a dielectric layer and first and second internal electrodes stacked to be alternately exposed to first and second external surfaces of the ceramic body while having the dielectric layer interposed therebetween, and first and second external electrodes disposed on the first and second external surfaces of the ceramic body so as to be electrically connected to the first and second internal electrodes, respectively; and an interposer including an insulating body disposed below the plurality of multilayer ceramic electronic components, a first terminal electrode disposed on the insulating body and electrically connected to at least a portion of the first external electrodes of the plurality of multilayer ceramic electronic components, and a second terminal electrode disposed on the insulating body and electrically connected to at least a portion of the second external electrodes of the plurality of multilayer ceramic electronic components, wherein the at least a portion of the first external electrodes of the plurality of multilayer ceramic electronic components are in electrical contact with each other, the at least a portion of the second external electrodes of the plurality of multilayer ceramic electronic components are in electrical contact with each other, the insulating body has a plurality of first recessed regions positioned below the first external electrodes, respectively, the insulating body has a plurality of second recessed regions positioned below the second external electrodes, respectively, the first terminal electrode includes first grooves each positioned between adjacent recessed regions of the plurality of first recessed regions and disposed on a first surface of the insulating body on which the plurality of multilayer ceramic electronic components are disposed, and the second terminal electrode includes second grooves each positioned between adjacent recessed regions of the plurality of second recessed regions and disposed on the first surface of the insulating body.

18. The multilayer ceramic electronic component array of claim 17, wherein the first terminal electrode includes a plurality of discrete first terminal electrodes positioned below the first external electrodes, respectively, and the second terminal electrode includes a plurality of discrete second terminal electrodes positioned below the second external electrodes, respectively.

\* \* \* \* \*